ative flux is directed at the polycrystalline semiconductor film surface to effect the physical orientation of the polycrystalline structure into a grain structure which is acceptable, i.e. will have acceptable semiconductor characteristics, for use in fabrication of a solar cell or the like.

United States Patent [19]
Radd et al.

[11] 4,187,126
[45] Feb. 5, 1980

[54] GROWTH-ORIENTATION OF CRYSTALS BY RASTER SCANNING ELECTRON BEAM

[75] Inventors: Fred J. Radd; Don H. Oertle; Charles N. McKinney, all of Ponca City, Okla.

[73] Assignee: Conoco, Inc., Ponca City, Okla.

[21] Appl. No.: 929,043

[22] Filed: Jul. 28, 1978

[51] Int. Cl.² ............... H01L 21/263; H01L 21/26
[52] U.S. Cl. .................... 148/1.5; 136/89 TF; 148/174; 148/175; 357/91; 427/86
[58] Field of Search ............... 148/1.5, 175, 174; 359/91; 427/53, 86; 156/610, 613; 136/89 TF

[56] References Cited

U.S. PATENT DOCUMENTS

| | | | |
|---|---|---|---|
| 3,290,189 | 12/1966 | Migitaka et al. | 148/188 |
| 3,382,114 | 5/1968 | Beauzee et al. | 148/186 |
| 3,950,187 | 4/1976 | Kirkpatrick | 148/1.5 |
| 4,003,770 | 1/1977 | Janowiecki | 148/174 |
| 4,042,447 | 8/1977 | Reitz | 156/610 |
| 4,059,461 | 11/1977 | Fan et al. | 148/1.5 |
| 4,087,571 | 5/1978 | Kamins et al. | 427/86 |
| 4,099,986 | 7/1978 | Diepers | 136/89 TF |
| 4,113,531 | 9/1978 | Zanio et al. | 148/174 |
| 4,113,532 | 9/1978 | Authier et al. | 148/174 |

OTHER PUBLICATIONS

Von Gutfeld, "... Si for Solar Cell...." IBM-TDB, 19 (1977) 3955.
Csepregi et al, "... Epitaxial Regrowth... Si... Amorphous Si", J. Appl. Phys. 49(7) (1978) 3906.

*Primary Examiner*—L. Dewayne Rutledge
*Assistant Examiner*—Upendra Roy
*Attorney, Agent, or Firm*—Richard W. Collins

[57] ABSTRACT

A method of grain-orienting the crystal structure of a layer of semiconductor material by application of a raster scanning electron beam to a layer of polycrystalline semiconductor material which has been previously formed on a substrate, such as by sputter-plasma film deposition. The method comprises electron beam lithography computer-applied to the crystal growth and orientation of a polycrystalline thin sheet of silicon or other semiconductor material.

5 Claims, No Drawings

GROWTH-ORIENTATION OF CRYSTALS BY RASTER SCANNING ELECTRON BEAM

BACKGROUND OF THE INVENTION

This invention relates to a method of manufacturing thin sheets of semiconductor material having an oriented crystal structure. Semiconductor material of high purity and crystalline perfection is desirable for a plurality of purposes. In many cases, a monocrystalline sheet of material is particularly desirable. This invention is directed to the manufacture of material useful in producing high quality photovoltaic cells at low cost.

Much of the power used by spacecraft and deep space probes is provided by photovoltaic solar energy cells made from thin silicon single crystal slices. In order to provide high purity single crystals of silicon for photovoltaic cells, this silicon is usually grown in single crystal ingots which are drawn slowly out of a hot melt of pure silicon. Wafers of silicon are then sliced from this single crystal ingot, for example with a diamond saw. These somewhat thin wafers are then further processed by conventional technology for use in photovoltaic cells. However, the diamond saw cut widths represent losses of valuable material. Also, the polishing step involves further costs, time and losses. Finally, the resultant polished oriented silicon wafer is much thicker than optically desirable.

Another method of forming layers of silicon materials is to deposit a layer from the vapor phase upon a support. The crystal structure of the layer may then be improved by subsequent melting of the layer. It has also been proposed to improve the structure of a layer of semiconductor material on a support by zone melting in which a molten zone is formed and moved through the layer of material.

Yet another approach to the problem is to pull out a thin capillary film of silicon from a melt, this either by the making of a wide ribbon or by the production of an oval or circular section. These capillary film growth methods are difficult because of crystal pulling problems and/or the subsequent handling problems with such thin, solid silicon films.

All of the foregoing methods are subject to limitations, particularly as to the expense involved in forming a layer of semiconductor material and also the limited dimensions and geometry of material which can be formed. A method for making large, thin sheets of semiconductor material having a highly oriented or monocrystalline structure is much to be desired. The reason for this thin films choice is that the cell resistance must be minimized, and thick sections are not optically necessary.

One approach to the manufacture of large sheets of semiconductor material is described in U.S. Pat. No. 3,382,114. This patent describes a method for manufacturing thin semiconductor plates using a zone melting treatment in which the semiconductor material is provided as a powder layer on a support. The upper surface of the powder layer is zone melted while separated from the support by part of the powder layer to reduce contamination. The material is then polished to provide a thin layer of crystalline semiconductor material.

While the above methods have been successful to varying degrees, prior to this invention there was no suitable method available for production of large, thin, oriented sheets of silicon or other semiconductor materials.

Accordingly, it is an object of this invention to provide a melting-orientation process for forming a large sheet of silicon suitable for use in a photovoltaic solar cell by the use of a raster scanning electron beam.

It is a further object to provide a method of making large sheets of oriented crystal semiconductor material of particular geometric designs, both from silicon and from other semiconducting metals and alloys.

SUMMARY OF THE INVENTION

According to the present invention, a polycrystalline layer of semiconductor material is first produced on a stable substrate, such as by sputter-plasma methods. This polycrystalline layer is then subjected to melting-orientation by an electron beam applied in rapid geometric scanning fashion. The melting may be accomplished by a computerized raster scanning electron beam applied to a large sheet of random crystal structure semiconductor material to produce an oriented crystal structure. The process of the invention also involves production of multi-layer components including layers of P and N type material to form a photovoltaic cell, and provides excellent geometric control of the P-N silica interfacial zone.

DESCRIPTION OF THE PREFERRED EMBODIMENTS

The following description refers to manufacture of large thin oriented sheets of silicon for use in photovoltaic solar energy cells, but the invention broadly is applicable to other materials. There are many important industrial applications for high quality, oriented crystals in thin sheet form.

The method of the invention in its broader form involves formation of a uniform coating of silicon on a heatable, vacuum-stable, hot substrate such as aluminum oxide, chromium oxide, zirconium oxide or the like. The substrate may be held upon or be a part of a metallic plate support. This film of silicon is preferably applied to the substrate by sputter-plasma methods which provide a thin film in an unoriented random polycrystalline state. The substrate is preferably maintained at a temperature of from 900°-1500° C. during the initial film formation to provide large grain formation. The stable, silicon-covered substrate is then subjected to a raster scanning electron beam to orient the crystal structure of the silicon. As will be apparent to those skilled in the art, the foregoing steps are conducted in a very high vacuum. In some cases, such as when the initial silicon film is N-type silicon, a layer of P-type silicon can then be sputter-plasma coated on the oriented initial silicon sheet and subsequently treated with the raster scanner electron beam to provide a large sheet of sandwich-type semiconductor material. The depth of the arbitrary thin P-N contact zone can be beam energy-controlled. The combination of extremely high vacuum with the electron beam heating provides an excellent final purification.

A more detailed process in accordance with the invention involves, as an initial step, the loading of a number of units of substrate material having the desired shape and dimensions into a raster scanning crystal growth machine. The interior of the raster scanning machine is then subjected to a high vacuum, such as $10^{-6}$ torr or better. It is desirable that the machine have a capability of $10^{-9}$ to $10^{-11}$ torr. The substrate units are then serially coated by sputter-plasma methods with either P or N type silicon. This deposited layer of silicon is an unoriented polycrystalline material uniformly deposited on the substrate in a thickness which can be as low as 10 to 100 microns. The unoriented, coarse-grained silicon coated sheets of material are then serially subjected to raster scan melting with one or more electron beam guns. Each electron beam gun can cover an area up to 25 to 30 cm wide at a linear growth rate of 1 to 5 cm per hour.

The oriented silicon sheet process up to the point described above provides large thin sheets of oriented crystal silicon. Normally, the above process will be carried out using a computerized raster scan machine which is specifically designed for this growth-orientation purpose. In this raster scan process, both the final smoothness of the first layer and the thickness of the P-N junction zone can be controlled by the electron sweep intensities.

The next step in the process, still within the evacuated raster scanning growth machine, involves coating the oriented crystal sheets with a layer of silicon of the opposite type. This second layer is then subjected to raster scan melting as was done with the initial layer. It may be desirable at this point in the process to stack completed silicon P-N sandwich cells. The vacuum is then broken on the raster scanning machine, and the finished cells are removed. Electrical leads are brazed onto the P and N sides of the sandwich cells as is well known in the art. The final step involves coating the exposed surfaces, using normal photocell techniques, with a suitable glass or other cover to prevent reaction and decay of the silicon film under atmospheric exposures.

The process of this invention was demonstrated experimentally as follows.

EXAMPLE 1

A film of silicon approximately 10 microns thick was deposited as an amorphous layer upon a single crystal of ruby sapphire substrate. This thin film of amorphous silicon was then raster scan-melted in place with an electron beam which was operated to produce, automatically, six parallel melt scans using the following conditions:

Accelerating Voltage: 28.4 KV, dc
Beam Emission Current: 0.480 mA
Sample Current: 0.014 mA The actual melting current, 0.014 mA, was line-scanned across the silicon film while a motor drive unit advanced the silicon film. The silicon film was analyzed by electron microscopy and by X-ray diffraction analysis both before and after the raster scan melting period. The original amorphous silicon film was found to be converted into an expitaxially-oriented silicon film.

The foregoing detailed description is intended to be exemplary rather than limiting, and numerous modifications and variations within the true scope of the invention will be apparent from consideration of the specification.

We claim:

1. A method of producing a thin sheet of oriented crystal semiconductor material comprising:
   (a) forming a layer of semiconductor material on a substrate;
   (b) subjecting said layer to a vacuum of at least $10^{-6}$ torr; and
   (c) applying a raster scanning electron beam to at least a portion of said layer under said vacuum to melt said portion of said layer and subsequently cause said portion of said layer to assume an oriented crystalline structure.

2. The method of claim 1 wherein said semiconductor material is silicon.

3. The method of claim 1 wherein said layer of semiconductor material is formed on said substrate by sputter-plasma treatment.

4. The method of claim 1 wherein a second layer of semiconductor material of the opposite type from said layer formed in step (a) of claim 1 is formed over said oriented first layer, and the crystal structure of said second layer is then oriented by application of a raster scanning electron beam thereto.

5. The method of claim 4 wherein said first layer is one of either P or N type silicon and said second layer is the other type silicon.

* * * * *